(12) United States Patent
Ku

(10) Patent No.: US 6,703,320 B1
(45) Date of Patent: Mar. 9, 2004

(54) SUCCESSFUL AND EASY METHOD TO REMOVE POLYSILICON FILM

(75) Inventor: Shao-Yen Ku, Hsin-Chu (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 60 days.

(21) Appl. No.: 10/036,898

(22) Filed: Jan. 4, 2002

(51) Int. Cl.[7] .............................................. H01L 21/302
(52) U.S. Cl. ....................... 438/745; 438/750; 438/751; 438/753; 438/756
(58) Field of Search ................................ 438/745, 750, 438/751, 753, 756

(56) References Cited

U.S. PATENT DOCUMENTS

| | | | | |
|---|---|---|---|---|
| 4,113,551 A | * | 9/1978 | Bassous et al. ............. | 438/753 |
| 5,030,590 A | | 7/1991 | Amini et al. ................ | 437/233 |
| 5,296,093 A | | 3/1994 | Szwejkowski et al. ....... | 156/643 |
| 5,328,867 A | * | 7/1994 | Chien et al. ................. | 438/301 |
| 5,431,777 A | | 7/1995 | Austin et al. ............. | 156/622.1 |
| 5,928,969 A | | 7/1999 | Li et al. ...................... | 438/753 |
| 5,963,804 A | | 10/1999 | Figura et al. ................ | 438/255 |
| 5,976,767 A | | 11/1999 | Li ................................ | 430/313 |
| 6,100,203 A | | 8/2000 | Kil et al. .................... | 438/745 |
| 6,551,913 B1 | * | 4/2003 | Kim et al. ................... | 438/592 |

* cited by examiner

Primary Examiner—Nadine G. Norton
Assistant Examiner—Binh X Tran
(74) Attorney, Agent, or Firm—George O. Saile; Stephen B. Ackerman; Stephen G. Stanton

(57) ABSTRACT

A method for removing a polysilicon layer from a non-silicon layer comprising the following steps. A structure having a non-silicon layer formed thereover is provided. A first polysilicon layer is formed upon the non-silicon layer. The first polysilicon layer is removed from over the non-silicon layer to expose the non-silicon layer using a $NH_4OH:DIW$ dip solution process having a $NH_4OH:DIW$ ratio of from about 1:2 to 1:8. Whereby the non-silicon layer is substantially unaffected by the $NH_4OH:DIW$ dip solution process.

43 Claims, 2 Drawing Sheets

SUCCESSFUL AND EASY METHOD TO REMOVE POLYSILICON FILM

FIELD OF THE INVENTION

The present invention relates generally to semiconductor fabrication and more specifically to reworking of semiconductor wafers by removing polysilicon films.

BACKGROUND OF THE INVENTION

Many times wafers must be scrapped if they suffer from thickness abnormally or particle problems after polysilicon deposition.

U.S. Pat. No. 5,928,969 to Li et al. describes a method for controlled selective polysilicon etching employing an $NH_4OH$ plus $NH_4F$ polysilicon etch and a hemispherical grain (HSG) polysilicon process.

U.S. Pat. No. 6,100,203 to Kil et al. describes a polysilicon etch and subsequent aqueous cleaning composition cleaner methods.

U.S. Pat. No. 5,431,777 to Austin et al. describes methods and compositions for the selective etching of silicon.

U.S. Pat. No. 5,296,093 to Szwejkowdki et al. describes a process for removal of residues remaining after etching a polysilicon layer.

U.S. Pat. No. 5,030,590 to Amini et al. describes a process for etching a polysilicon layer in the formation of an integrated circuit structure.

U.S. Pat. No. 4,113,551 to Bassous et al. describes a method for polycrystalline silicon etching with tetramethylammonium hydroxide.

U.S. Pat. No. 5,963,804 to Figura et al. describes a method of making a doped silicon structure with an impression image on opposing roughened surfaces.

U.S. Pat. No. 5,976,767 to Li describes a process for selectively removing silicon containing material using an ammonium hydroxide etch.

SUMMARY OF THE INVENTION

Accordingly, it is an object of an embodiment of the present invention to provide an improved method of selectively removing polysilicon.

Other objects will appear hereinafter.

It has now been discovered that the above and other objects of the present invention may be accomplished in the following manner. Specifically, a structure having a non-silicon layer formed thereover is provided. A first polysilicon layer is formed upon the non-silicon layer. The first polysilicon layer is removed from over the non-silicon layer to expose the non-silicon layer using a $NH_4OH{:}DIW$ dip solution process having a $NH_4OH{:}DIW$ ratio of from about 1:2 to 1:8. Whereby the non-silicon layer is substantially unaffected by the $NH_4OH{:}DIW$ dip solution process.

BRIEF DESCRIPTION OF THE DRAWINGS

The present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Unless otherwise specified, all structures, layers, steps, methods, etc. may be formed or accomplished by conventional steps or methods known in the prior art.

Initial Structure

Figure 1:
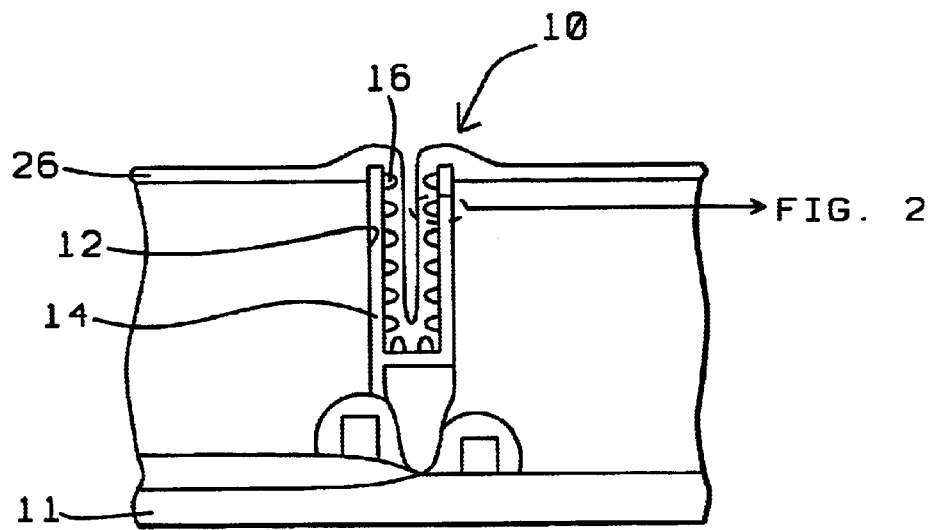
FIGS. 1 to 4 schematically illustrate a preferred embodiment of the present invention, with FIGS. 2 through 4 being an enlargement of a portion of FIG. 1 designated "FIG. 2" and illustrating the method of the present invention.

FIG. 1 illustrates a dynamic random access memory (DRAM) structure 10 formed on a structure 11. Commonly many such DRAM structures 10 are formed on structure 11 along with other integrated circuit devices (not shown).

Structure 11 is preferably a silicon substrate and is understood to possibly include a semiconductor wafer or substrate, active and passive devices formed within the wafer, conductive layers and dielectric layers (e.g., interpoly oxide (IPO), intermetal dielectric (IMD), etc.) formed over the wafer surface. The term "semiconductor structure" is meant to include devices formed within a semiconductor wafer and the layers overlying the wafer.

DRAM structure 10 includes a trench 12 lined with a polysilicon (poly) layer 14. Poly layer 14 is preferably from about 400 to 460 Å thick, is more preferably from about 415 to 445 Å thick and is most preferably about 430 Å thick.

Rugged poly nodules 16 are formed over the surface of poly layer 14 within trench 12. An ONO capacitor dielectric layer 18 (not shown in FIG. 1—see FIGS. 2 to 4 for a detailed description of the ONO capacitor dielectric layer 18) is formed over the rugged poly nodules 16 and over the surface of poly layer 14.

A poly layer 26 is formed over the ONO capacitor dielectric layer 18 to a thickness of preferably from about 640 to 780 Å, more preferably from about 675 to 745 Å thick and most preferably about 710 Å. It is noted the method of the present invention is not limited to the above thicknesses of the poly layer 26.

Detailed View of Rugged Poly Nodules 16

Figure 2:
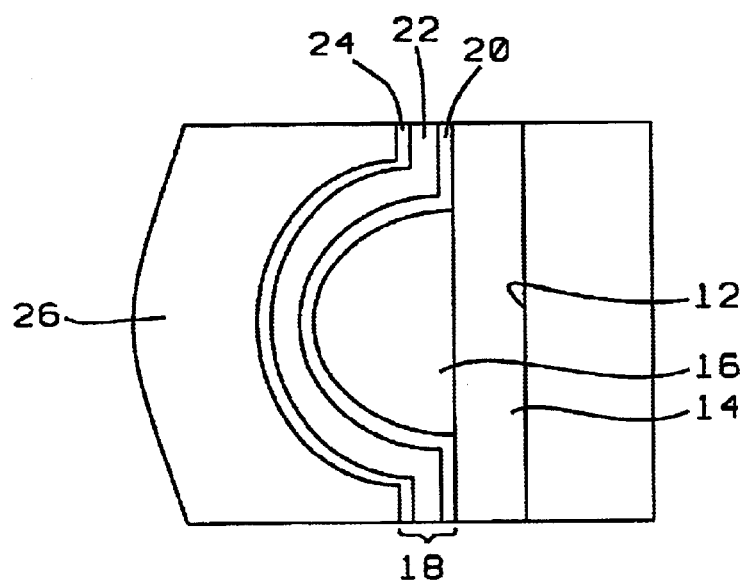

FIG. 2 is an enlarged portion of FIG. 1 designated "FIG. 2" showing a detailed view of a sample rugged poly nodule 16 and showing, inter alia, the ONO capacitor dielectric layer 18.

As shown in FIG. 2, ONO capacitor dielectric layer 18 is comprised of: an inner silicon oxide (oxide) layer 20 adjacent rugged poly nodules 16 and the surface of poly layer 14; a middle silicon nitride (nitride) layer 22 over the inner oxide layer 20; and an outer oxide layer 24 over the middle nitride layer 22.

Inner oxide layer 20 is preferably from about 10 to 14 Å thick, is more preferably from about 11 to 13 Å thick and is most preferably about 12 Å thick. Middle nitride layer 22 is preferably from about 39 to 48 Å thick, is more preferably from about 41 to 45 Å thick and is most preferably about 43 Å thick.

Outer oxide layer 24 is preferably from about 22 to 28 Å thick, is more preferably from about 24 to 26 Å thick and is most preferably about 25 Å thick Outer oxide layer 24 may be comprised of silicon oxide, an ONO composite layer, nitride, TEOS oxide or HTO oxide.

For a variety of reasons, such as, for example, an abnormal thickness or a particle abnormality, the poly layer 26 formed over the ONO capacitor dielectric layer 18 may be found to be defective and would result in an unacceptable failure or poor performance rate of at least the DRAM devices 10. To re-work, or reuse the wafer, the poly layer 26 must be removed and replaced.

Removal of Defective Poly Layer 26—Key Step of the Invention

Figure 3:
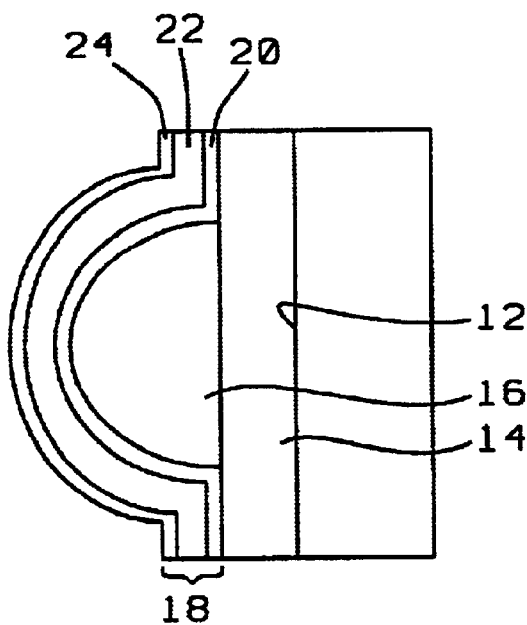

As shown if FIG. 3, the defective poly layer 26 is removed from the structure of FIG. 2 without appreciable affecting the outer oxide layer 24 of the ONO capacitor dielectric layer 18.

First, an HF dip is used to remove any native oxide formed on the defective poly layer 26 surface. The HF dip is preferably performed using about a 2.5% HF solution at about 25° C. for about 30 seconds.

The structure is then subjected to a five (5) minute deionized water (DIW) rinse.

Then, in a key step of the invention, the defective poly layer 26 is stripped using a $NH_4OH$:deionized water (DIW) dip at temperature of preferably from about 25 to 60° C., more preferably from about 30 to 50° C. and most preferably about 40° C. until bubble formation ceases. The bubbles formed are a very small amount of $H_2$ and has no impact on the fabrication (fab) operation. Visual monitoring of the $NH_4OH$:DIW dip solution may be used to determine when bubble formation ceases which indicates that the poly layer 26 strip is complete.

The $NH_4OH$:DIW dip is preferably from about 1:2 to 1:8 $NH_4OH$:DIW, more preferably from about 1:4 to 1:6 $NH_4OH$:DIW and most preferably about 1:5 $NH_4OH$:DIW.

The $NH_4OH$:DIW dip has a high etch selectivity of poly:oxide so that the outer oxide layer 24 of the ONO capacitor dielectric layer 18 underlying the defective poly layer 26 is not itself partially or completely removed. The poly:oxide selectivity of the $NH_4OH$:DIW dip is preferably about 680:1, more preferably about 1650:1 and most preferably about 1160:1. The poly etch rate (E/R) is preferably about 560 Å/minute, more preferably from about 560 Å/minute to 580 Å/minute and is most preferably about 580 Å/minute.

The use of the $NH_4OH$:DIW dip of the present invention must be used in the absence of $H_2O_2$ as the inventor has discovered that even a small amount of $H_2O_2$ severely impacts the etch selectivity, for example from about 580 Å/minute to below about 2 Å/minute.

Spiking conditions must also be considered because $NH_4OH$ easily evaporates, especially at high temperature, i.e. above about 40° C. That is, a small amount of $NH_4OH$ is added, or spiked, to the process tank to make up for the evaporated $NH_4OH$ during the processing period.

The inventor has determined that, compared to other poly etch solutions, the $NH_4OH$:DIW solution of the present invention has a much superior poly:oxide selectivity, for example:

| Chemical Solution | Poly E/R (Å/min) | Oxide E/R (Å/min) | Selectivity (Poly:Oxide) |
|---|---|---|---|
| 1:5 $NH_4OH$:DIW | about 580 | about 0.5 | about 1160 |
| 2.5% HF @ 25° C. | < about 10 | about 160 | <about 1 |
| 1:1:5 APM @ 40° C. | about 0.13 | about 0.29 | <about 1 |
| 155° C. $H_3PO_4$ | about 8 | <about 1 | about 8 |
| M1 (HF/$HNO_3$/ $CH_3COOH$) | about 14,000 | about 400 | about 35 |

Where "APM" is ammonia peroxide mixture ($NH_4OH$/ $H_2O_2$/deionized water (DIW)).

The selectivity for all but the $NH_4OH$:DIW solution of the present is too low to protect the outer oxide layer 24 during the poly etching and the etch rate for the M1 solution (poly:14,000 Å/minute and oxide: 400 Å/minute), which has a poly:oxide selectivity of 35, is much too great to protect the outer oxide layer 24 during the poly etch.

Further, the inventor has determined that, at about 40° C. the selectivity of the $NH_4OH$:DIW solution of the present invention varies as shown below for changes in the $NH_4OH$:DIW ratio as shown:

| $NH_4OH$:DIW ratio | 1:2 | 1:5 | 1:8 |
|---|---|---|---|
| Selectivity (Poly/Oxide) | about 1650 | about 1160 | about 680 |

Further yet, the inventor has determined that, at about 1:8 $NH_4OH$:DIW ratio, the selectivity of the $NH_4OH$:DIW solution of the present invention varies as shown below for the changes in the temperature as shown.

| Temperature | 25° C. | 40° C. | 60° C. |
|---|---|---|---|
| Selectivity (Poly/Oxide) | about 320 | about 680 | about 940 |

DIW Rinse

The structure of FIG. 3 is then subjected to a DIW rinse lasting for preferably about 5 minutes and the structure is then dried.

Re-Deposition of Polysilicon

Figure 4:
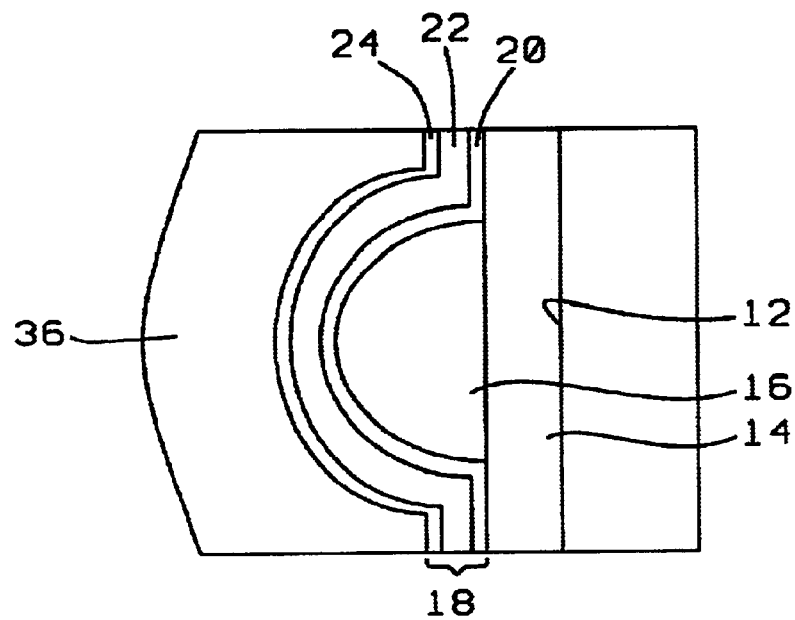

As shown in FIG. 4, polysilicon is redeposited over the ONO capacitor dielectric layer 18 to form polysilicon layer 36 having a thickness of preferably from about 640 to 780 Å, more preferably from about 675 to 745 Å thick and most preferably about 710 Å.

Although removing polysilicon from over an ONO layer has been described, the method of the present invention is admirably suited in removing or stripping polysilicon from over other layers except silicon. Such other layers may be comprised of, for example, nitride or metal oxide such as TaO. Nitride layers would be stripped by $H_3PO_4$ on IC tab, metal oxide layers would be stripped according to their oxide characteristics with TaO layers being stripped of polysilicon using $H_2O_2$ for example.

Experimental Results

The inventor obtained the following WAT/CP data of reworked runs of wafers designated R 15880.1, R 15906.1 and R 15909.1:

| | Capacitor Performance | RSP3NR* | Yield |
|---|---|---|---|
| Spec Low | 23 | 190 | |
| Spec High | 45 | 250 | |
| R 15880.1 | 32.66 | 224.68 | 78.6% |
| R 15906.1 | 31.75 | 183.89 | 66.9% |
| R 15909.1** | 32.97 | 220.37 | 59.9%* |

*If poly layer 26 were not completely stripped, the RSP3NR factor (which checks poly resistivity) will show up.
**The R 15909.1 yield of 59.9% was lower due to the fact that 16 wafers suffered low yield while the other wafers were normal. Other factors were suspected to have dominated the lower 59.9% yield apart from the method of the present invention.

With the "Spec Low" and "Spec High" being the required ranges for the indicated parameters.

ADVANTAGES OF THE PRESENT INVENTION

The advantages of the present invention include:
1. high etch selectivity for polysilicon:non-silicon film;
2. an easy and visible judgement method is provided to confirm process completion;
3. less damage to non-silicon films;

4. low cost process;
5. safety methodology on this procedure; and
6. no extra machine retrofit requirement.

While particular embodiments of the present invention have been illustrated and described, it is not intended to limit the invention, except as defined by the following claims.

I claim:

1. A method for removing a polysilicon layer from a non-silicon layer, comprising the steps of:
   providing a structure having a non-silicon layer formed thereover;
   forming a first polysilicon layer upon the non-silicon layer;
   removing substantially all of the first polysilicon layer from over the non-silicon layer to expose the non-silicon layer using a $NH_4OH:DIW$ dip solution process having a $NH_4OH:DIW$ ratio of from about 1:2 to 1:8; and
   then forming a second polysilicon layer over the exposed non-silicon layer; whereby the non-silicon layer is substantially unaffected by the $NH_4OH:DIW$ dip solution process.

2. The method of claim 1, wherein the $NH_4OH:DIW$ dip solution process is conducted at a temperature of from about 25 to 60° C.; the $NH_4OH:DIW$ dip solution process having a polysilicon:non-silicon selectivity of at least about 680:1 and a polysilicon etch rate of from about 560 to 580 Å/minute.

3. The method of claim 1, wherein the $NH_4OH:DIW$ ratio is from about 1:4 to 1:6; and the $NH_4OH:DIW$ dip solution process is conducted at a temperature of from about 30 to 50° C. and a polysilicon:non-silicon selectivity of at least about 1160:1.

4. The method of claim 1, wherein the $NH_4OH:DIW$ ratio is about 1:5; and the $NH_4OH:DIW$ dip solution process is conducted at a temperature of about 40° C. and a polysilicon:non-silicon selectivity of at least about 1650:1.

5. The method of claim 1, wherein the $NH_4OH:DIW$ dip solution process is conducted at a polysilicon:non-silicon selectivity of about 680:1.

6. The method of claim 1, wherein and the $NH_4OH:DIW$ dip solution process is conducted at a polysilicon:non-silicon selectivity of about 1650:1.

7. The method of claim 1, wherein and the $NH_4OH:DIW$ dip solution process is conducted at a polysilicon:non-silicon selectivity of about 11,600:1.

8. The method of claim 1, including the step of removing any native oxide from the first polysilicon layer using an HF dip before removal of the first polysilicon layer.

9. The method of claim 1, including the steps of:
   removing any native oxide from the first polysilicon layer using an HF dip before removal of the first polysilicon layer; and
   rinsing the first polysilicon layer with DIW immediately after the removal of any native oxide.

10. The method of claim 1, wherein the non-silicon layer is comprised of a material selected from the group consisting of: silicon oxide; an ONO composite layer; nitride; TEOS oxide and HTO oxide.

11. The method of claim 1, wherein the first polysilicon layer is from about 640 to 780 Å thick.

12. The method of claim 1, wherein the first polysilicon layer is from about 675 to 745 Å thick.

13. The method of claim 1, wherein the first polysilicon layer is about 710 Å thick.

14. The method of claim 1, wherein completion of the $NH_4OH:DIW$ dip solution process is visually observable.

15. The method of claim 1, wherein the second polysilicon layer is an electrode in a capacitor.

16. A method for removing a polysilicon layer from a silicon oxide layer, comprising the steps of:
   providing a structure having a silicon oxide layer formed thereover;
   forming a first polysilicon layer upon the silicon oxide;
   using an HF dip to remove any native oxide from over the first polysilicon layer;
   rinsing the first polysilicon layer with DIW;
   removing substantially all of the first polysilicon layer from over the silicon oxide layer to expose the silicon oxide layer using a $NH_4OH:DIW$ dip solution process having a $NH_4OH:DIW$ ratio of from about 1:2 to 1:8 at a temperature of from about 25 to 60° C.; the $NH_4OH:DIW$ dip solution process having a polysilicon:non-silicon selectivity of at least about 680:1 and a polysilicon etch rate of from about 560 to 580 Å/minute; and
   forming a second polysilicon layer over the exposed silicon oxide layer; whereby the silicon oxide layer is substantially unaffected by the $NH_4OH:DIW$ dip solution process.

17. The method of claim 16, wherein the $NH_4OH:DIW$ ratio is from about 1:4 to 1:6; the temperature is from about 30 to 50° C.; and the polysilicon:silicon oxide selectivity is at least about 1160:1.

18. The method of claim 16, wherein the $NH_4OH:DIW$ ratio is about 1:5; the temperature is about 40° C.; and the polysilicon:silicon oxide selectivity is at least about 1650:1.

19. The method of claim 16, wherein the polysilicon:silicon oxide selectivity is about 680:1.

20. The method of claim 16, wherein the polysilicon:silicon oxide selectivity is about 1650:1.

21. The method of claim 16, wherein the polysilicon:silicon oxide selectivity is about 11,600:1.

22. The method of claim 16, including the step of rinsing the exposed silicon oxide layer with DIW and drying the exposed silicon oxide layer before formation of the second polysilicon layer over the exposed silicon oxide layer.

23. The method of claim 16, whereby the HF dip is conducted for about 30 seconds at about 25° C. using a 2.5% HF solution.

24. The method of claim 16, whereby the DIW rinse of the HF dipped first polysilicon layer is conducted for about 5 minutes and the DIW rinse of the exposed silicon oxide layer is conducted for about 5 minutes.

25. The method of claim 16 whereby the silicon oxide layer is from about 22 to 28 Å thick.

26. The method of claim 16 whereby the silicon oxide layer is from about 24 to 26 Å thick.

27. The method of claim 16 whereby the silicon oxide layer is about 25 Å thick.

28. The method of claim 16, wherein completion of the $NH_4OH:DIW$ dip solution process is visually observable.

29. The method of claim 16, wherein the second polysilicon layer is an electrode in a capacitor.

30. A method for removing a polysilicon layer from a silicon oxide layer, comprising the steps of;
   providing a structure having a silicon oxide layer formed thereover;
   forming a first polysilicon layer upon the silicon oxide;
   using an HF dip to remove any native oxide from over the first polysilicon layer;
   rinsing the first polysilicon layer with DIW;

removing substantially all of the first polysilicon layer from over the silicon oxide layer to expose the silicon oxide layer using a $NH_4OH:DIW$ dip solution process having a $NH_4OH:DIW$ ratio of from about 1:2 to 1:8 at a temperature of from about 25 to 60° C.; the $NH_4OH:DIW$ dip solution process having a polysilicon:non-silicon selectivity of at least about 680:1 and a polysilicon etch rate of from about 560 to 580 Å/minute;

rinsing the exposed silicon oxide layer;

forming a second polysilicon layer over the exposed rinsed silicon oxide layer;

whereby the silicon oxide layer is substantially unaffected by the $NH_4OH:DIW$ dip solution process.

31. The method of claim 30, wherein the $NH_4OH:DIW$ ratio is from about 1:4 to 1:6; the temperature is from about 30 to 50° C.; and the polysilicon:silicon oxide selectivity is at least about 1160:1.

32. The method of claim 30, wherein the $NH_4OH:DIW$ ratio is about 1:5; the temperature is about 40° C.; and the polysilicon:silicon oxide selectivity is at least about 1650:1.

33. The method of claim 30, wherein the polysilicon:silicon oxide selectivity is about 680:1.

34. The method of claim 30, wherein the polysilicon:silicon oxide selectivity is about 1650:1.

35. The method of claim 30, wherein the polysilicon:silicon oxide selectivity is about 11,600:1.

36. The method of claim 30, including the step of drying the exposed rinsed silicon oxide layer before formation of the second polysilicon layer over the exposed rinsed silicon oxide layer.

37. The method of claim 30, whereby the HF dip is conducted for about 30 seconds at about 25° C. using a 2.5% HF solution.

38. The method of claim 30, whereby the DIW rinse of the HF dipped first polysilicon layer is conducted for about 5 minutes and the DIW rinse of the exposed silicon oxide layer is conducted for about 5 minutes.

39. The method of claim 30 whereby the silicon oxide layer is from about 22 to 28 Å thick.

40. The method of claim 30 whereby the silicon oxide layer is from about 24 to 26 Å thick.

41. The method of claim 30 whereby the silicon oxide layer is about 25 Å thick.

42. The method of claim 30, wherein completion of the $NH_4OH:DIW$ dip solution process is visually observable.

43. The method of claim 30, wherein the second polysilicon layer is an electrode in a capacitor.

* * * * *